(12) United States Patent
Strauss

(10) Patent No.: US 6,310,497 B1
(45) Date of Patent: Oct. 30, 2001

(54) POWER SUPPLY LOSS DETECTOR METHOD AND APPARATUS

(75) Inventor: Mark S. Strauss, Allentown, PA (US)

(73) Assignee: Agere Systems Guardian Corp., Orlando, FL (US)

(*) Notice: Subject to any disclaimer, the term of this patent is extended or adjusted under 35 U.S.C. 154(b) by 0 days.

(21) Appl. No.: 09/562,306

(22) Filed: May 1, 2000

(51) Int. Cl.[7] ........................................... H03L 7/00
(52) U.S. Cl. ............................... 327/143; 327/198
(58) Field of Search ............................ 327/142, 143, 327/198, 72, 77, 78; 365/229

(56) References Cited

U.S. PATENT DOCUMENTS

| | | | |
|---|---|---|---|
| 4,902,907 | * 2/1990 | Haga et al. | 327/143 |
| 4,984,211 | * 1/1991 | Tran | 365/229 |
| 5,166,546 | * 11/1992 | Savignac et al. | 327/143 |
| 5,457,414 | 10/1995 | Inglis et al. | 327/77 |
| 5,619,156 | * 4/1997 | Jandu | 327/198 |
| 5,721,502 | * 2/1998 | Thomson et al. | 327/143 |

* cited by examiner

Primary Examiner—Jung Ho Kim
(74) Attorney, Agent, or Firm—Synnestvedt & Lechner LLP

(57) ABSTRACT

A power loss detector for generating a signal indicating the need to switch from a main power supply to an auxiliary power supply responsive to detecting that the main power supply has dropped below a predetermined threshold.

27 Claims, 2 Drawing Sheets

POWER SUPPLY LOSS DETECTOR METHOD AND APPARATUS

FIELD OF THE INVENTION

The invention pertains to power loss detection in a circuit. More particularly, the invention pertains to detecting loss of a main power supply in order to generate a control signal for switching to an auxiliary power supply.

BACKGROUND OF THE INVENTION

Many electronic devices are designed with auxiliary power supplies that turn on when a main power supply fails. For instance, it is desirable and, in fact, standard practice to provide an on-board battery back-up power source in computers for keeping the time and date clock circuitry running when the main power source for the computer is off so that the computer always has the current date and time available. For example, in a laptop computer, a power supply detector circuit must be provided to detect when the portable laptop computer is plugged into an AC outlet. When it is plugged into an AC outlet, power to run the computer is supplied from the AC outlet. However, when the computer is unplugged, that absence of the power from the AC input terminal of the computer must be detected so that the computer can be switched over to operate from the on-board battery power supply.

In general, the power loss detector circuits of the prior art comprise a comparator for comparing the voltage supplied by the main power supply to the voltage supplied by the auxiliary (e.g., battery) power supply. The voltage provided by the main power supply and the voltage provided by the battery are provided to the two inputs of a comparator through respective voltage dividers. The voltage dividers are ratioed so that the comparator output switches states when the main power supply drops below a predetermined threshold. For instance, in a notebook computer, the 120V AC power available from an outlet is converted to 3.3V DC which is used to power all the circuits in the computer. The battery, on the other hand, may be regulated to provide 3V of power. The resistor dividers corresponding to the main power and the auxiliary power may be ratioed such that the comparator output will switch states when the main power supply drops below 2.8V. The output of the comparator is then used as a main power supply loss indicator signal. When that signal switches state, indicating that the main power supply has dropped below 2.8V, a power supply switching circuit switches to auxiliary power.

U.S. Pat. No. 5,457,414 entitled Power Supply Loss Sensor discloses another power loss detector circuit. In the circuit disclosed in that patent, ring oscillators and other digital circuitry are used in the scheme for detecting power loss.

In both of the above-described schemes, the auxiliary or battery power supply is compared to the main power supply. Accordingly, a constant DC drain on the auxiliary power supply is needed for the operation of the power loss detector circuit. Over very long periods of time between rechargings, the battery can be completely drained.

Accordingly, it is an object of the present invention to provide an improved power loss detection method and apparatus.

It is another object of the present invention to provide a power loss detection method and apparatus which does not consume DC power from the auxiliary power supply.

SUMMARY OF THE INVENTION

The invention is a power loss detector circuit for an integrated circuit that asserts a signal when the main power drops below a predetermined threshold. The detector circuit is very simple and comprises two transistors, a resistor divider network and, optionally, an inverter.

The main power source is supplied to one end of the voltage divider. The voltage divider produces a voltage signal that is a fraction of the main power supply voltage. The main power supply voltage also is provided to the source terminal of a transistor. The fractional voltage is provided to the gate terminal of the same transistor. The voltage divider is configured such that the difference between the power supply voltage and the fractional voltage when the power supply voltage is at the minimum acceptable level is equal to the threshold voltage of the transistor. The minimum acceptable level is the point at which it is desired to switch from the main power supply to an auxiliary power supply. Thus, when the main voltage supply is greater than the minimum acceptable level, the transistor is turned on. Otherwise, it is off. The drain of the transistor is coupled to the output node of the detector circuit. This node is also coupled to the drain of a second transistor having its source coupled to ground. The gate of the second transistor is coupled to the auxiliary power supply such that the second transistor is on as long as the auxiliary power supply is sufficient, i.e, greater than the threshold voltage of the second transistor. Alternately, the gate of the second transistor is coupled to a second voltage level through an inverter that is powered by the auxiliary power supply.

Thus, when the main voltage supply is greater than the minimum acceptable level, the transistor is turned on. Otherwise, it is off. The drain of the transistor is coupled to the output node of the detector circuit. This node is also coupled to the drain of a second transistor having its source coupled to ground. The gate of the second transistor is coupled to the auxiliary power supply such that the second transistor is on as long as the auxiliary power supply is sufficient, i.e, greater than the threshold voltage of the second transistor.

The second transistor has a much longer channel than the first transistor so that it has a much higher impedance. Accordingly, regardless of whether the second transistor is on or off, if the main power supply is above the minimum acceptable level, the output node is driven to the voltage provided by the main power supply, i.e., logic high. Thus, a logic high at the output node indicates that the main power supply is operational and should be used to power the integrated circuit. Only when the main power supply drops below the minimum level, thus turning the first transistor off, can the second transistor drive the output terminal to ground (i.e., logic low). Accordingly, a logic low level at the output node indicates that the main power supply is off or has dropped below the predetermined minimum voltage and power should be switched to auxiliary power.

The circuit draws no DC current from the auxiliary power supply. The auxiliary power supply used to power the inverter draws only transient current when the comparator output switches.

DETAILED DESCRIPTION OF THE INVENTION

Figure 1:
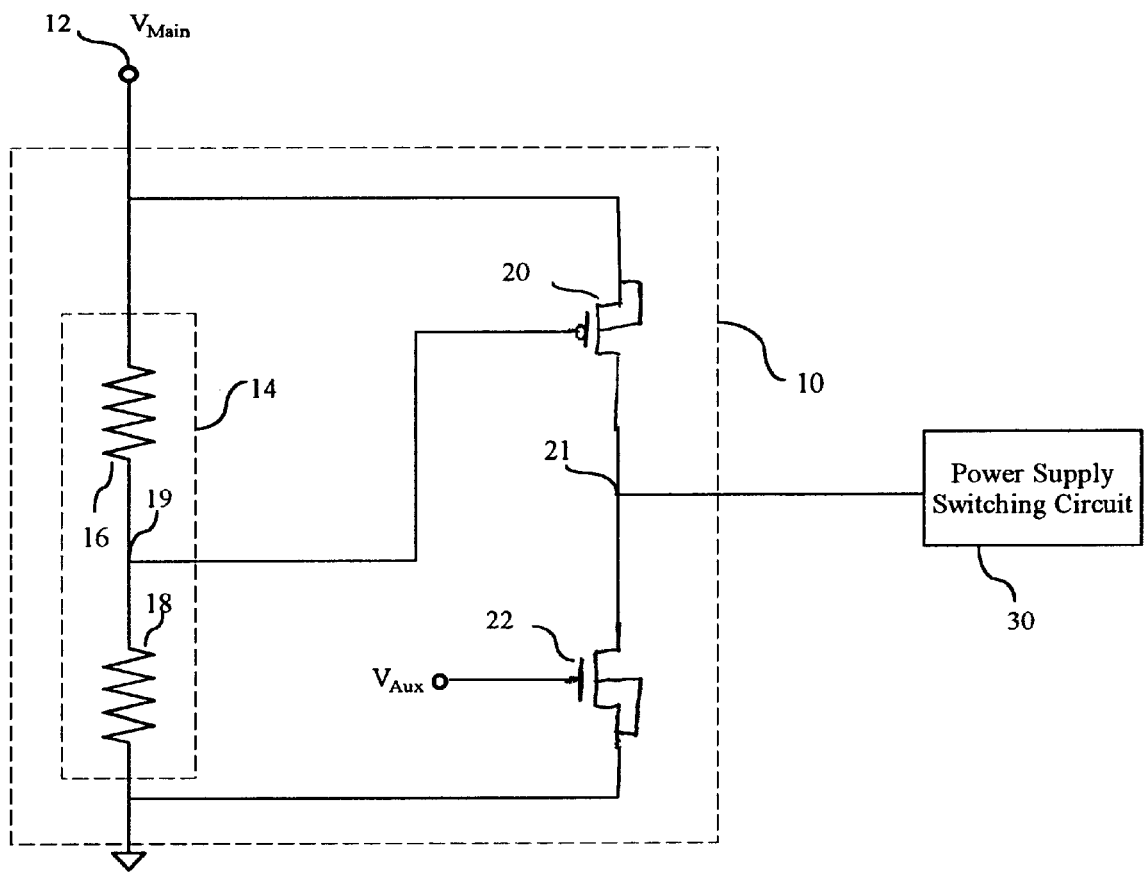
FIG. 1 is a circuit diagram of a power loss detector circuit in accordance with the present invention.

FIG. 1 is a circuit diagram of a power loss detector circuit in accordance with the present invention. Circuit 10 comprises a resistor divider network 14 comprising resistors 16 and 18, a p-channel transistor 20, and an n-channel transistor 22. A main power supply 12, $V_{Main}$, is supplied to one of the current flow terminals (e.g., the source terminal) of the p-channel transistor 20. It also is supplied to the top of the resistor divider network 14. In most integrated circuits, nominal main power is usually either 3.3 volts or 5 volts and is derived from an AC power source through a step-down DC rectifier circuit.

The resistor divider network 14 comprises two resistors 16 and 18 and a node 19 between the resistors 16 and 18. Node 19 is provided to the control terminal (i.e., the gate) of p-channel transistor 20. The other current flow terminal of transistor 20 (the drain) is coupled to node 21, which is the output node of the detector circuit that indicates when to switch between the main and auxiliary power sources. Resistor divider network 14 generates a voltage at node 19 which is a fraction of $V_{Main}$ (hereinafter termed $V_{MainR}$). The ratio between $V_{Main}$ and $V_{MainR}$, of course, remains the same regardless of the value of $V_{Main}$. Therefore, as $V_{Main}$ drops in voltage, the ratio between $V_{Main}$ and $V_{MainR}$ remains the same, but the difference between $V_{Main}$ and $V_{MainR}$ decreases. $V_{Main}$ is supplied to the gate of transistor 20. Thus, transistor 20 is turned on and off as a function of the difference between $V_{Main}$ and $V_{MainR}$. In particular, as the voltage $V_{Main}$ decreases, the difference between $V_{Main}$ and $V_{MainR}$ decreases (because the ratio therebetween stays the same). When $V_{Main}-V_{MainR}$ is greater than the threshold voltage of p-channel transistor 20, transistor 20 is on. However, when $V_{Main}-V_{MainR}$ drops below the threshold voltage of transistor 20, transistor 20 is turned off. Resistors 16 and 18 of resistor divider network 14 are ratioed so that $V_{Main}-V_{MainR}$ will be equal to the threshold voltage of transistor 20 when $V_{Main}$ is the minimum voltage desired from the main power supply before power should be switched over to the auxiliary power supply, e.g., 2.8 volts.

N-channel transistor 22 has one of its current flow terminals (e.g., its source terminal) coupled to ground, the other current flow terminal (drain) coupled to node 21, and its control terminal (gate) coupled to the auxiliary power supply, $V_{Aux}$. Accordingly, the gate of n-channel transistor 22 is held high and n-channel transistor 22 is on at all times. However, transistor 22 has a very long channel relative to transistor 20 and thus offers a higher impedance between node 21 and ground than the impedance of transistor 20 between $V_{Main}$ and node 21. Accordingly, with transistor 20 on, node 21 remains high even when transistor 22 is on. Specifically, node 21 is held at approximately $V_{Main}$ (the actual voltage at node 21 is slightly below $V_{Main}$ because of the small voltage drop across transistor 20 and the small current drain to ground through transistor 22). However, when $V_{Main}$ drops below the minimum acceptable voltage, transistor 20 turns off. Then, transistor 22 will quickly drive node 21 to ground.

Note that if the auxiliary power supply fails while the main power supply is still operational, the circuit 10 still operates in the same manner. Specifically, if $V_{aux}$ drops to zero volts, it turns off transistor 22. However, this has no affect on output node 21 which, as mentioned above, is held high when the main power supply is above the minimum acceptable level regardless of whether transistor 22 is on or off.

The signal on node 21 is provided to a power supply switching circuit 30. Power supply switching circuit 30 is designed to select the main power supply to power the integrated circuit when signal 29 is high and to switch to the auxiliary power supply when line 29 goes low.

Accordingly, circuit 10 provides the necessary control signal (the signal at node 21) indicating when the main power supply has dropped below an acceptable level. Circuit 10 draws no DC current from the auxiliary power supply since it is used for no purpose in circuit 10 other than as the input to the high impedance gate of transistor 22.

Figure 2:
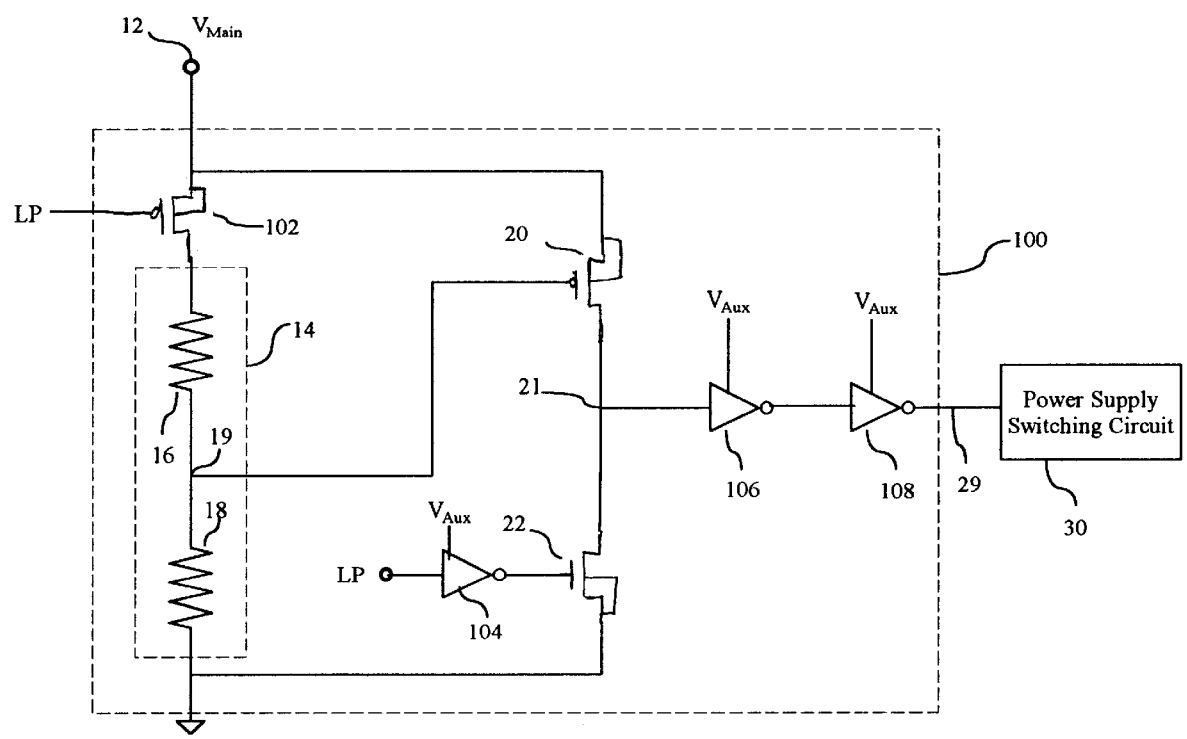
FIG. 2 is a circuit diagram of a second embodiment of a power supply loss detector circuit in accordance with the present invention.

FIG. 2 illustrates a preferred embodiment of the invention particularly adapted for use in a circuit which must be IDDQ friendly. IDDQ friendly chips must be able to be placed in a quiescent state in which the chip draws no power so the chip to be tested for various purposes. FIG. 2 illustrates a circuit 100 in accordance with the present invention adapted for IDDQ friendly mode operation. Those circuit components which are the same as those shown in the FIG. 1 embodiment bear the same reference numerals. The circuit of FIG. 2 is essentially the same as that of circuit 1 except that for the addition of transistor 102 and inverters 104, 106 and 108. The current flow terminals of transistor 102 are coupled between $V_{Main}$ 12 and the resistor divider network 14. The gate of p-channel transistor 102 is coupled to an IDDQ friendly mode signal (shown in the drawing as LP for Low Power). LP is also coupled to the input of an inverter 104. Inverter 104 drives the gate of n-channel transistor 22 rather than $V_{aux}$. However, $V_{aux}$ provides the power to inverter 104. Further, in a preferred embodiment, inverters 106 and 108 are added at the output in order to buffer the output node 21 from the power supply switching circuit 30. Inverters 106 and 108 also receive their power from $V_{AUX}$.

In normal operation (i.e., non-IDDQ friendly mode), operation is essentially exactly as described above in connection with FIG. 1. Particularly, since LP is at logic low, transistor 102 is fully on and has essentially no affect on circuit operation. Further, the gate of transistor 22 is held at logic high (by virtue of inverter 104 being powered by $V_{aux}$), just as in the FIG. 1 embodiment.

However, in IDDQ friendly mode, LP is asserted high. Accordingly, transistor 102 is turned off such that $V_{main}$ does not reach the voltage divider 14. Accordingly, node 19 of resistor voltage divider goes to ground. Since the source of transistor 20 is still coupled directly to $V_{main}$, transistor 20 remains on. With LP asserted high, the output of inverter 24 now goes low turning transistor 22 off. Therefore, node 21 remains high, thus instructing power supply switching circuit 30 to provide power to the circuit from the main power supply $V_{Main}$. Thus, in IDDQ friendly mode, resistor divider network 14 draws no power, yet still maintains a logic high level on node 21 to indicate that main power is to remain in use. Inverters 106 and 108 are not necessary, but are provided in a preferred embodiment to buffer node 21 from the power supply switching circuit 30. Like inverter 104, inverters 106 and 108 are powered by the auxiliary power supply rather than the main power supply because they need to remain functional when the main power supply fails so that the circuit can be switched over to auxiliary power.

It should be understood that, while the detector circuit of the present invention has been described above in connection with several preferred embodiments utilizing CMOS transistors, the circuit can be readily implemented with other types of transistors. Further, logic level polarities and magnitudes can be readily changed without departing from the spirit of the invention.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

I claim:

1. A detector circuit for detecting when a power source fails, said circuit comprising:
   a resistor divider network coupled between said power source and a fixed voltage, said resistor divider network having a node at which a voltage is induced that is a fraction of a voltage of said power source;
   a first transistor having a pair of current flow terminals coupled between said power source and an output terminal of said circuit, said first transistor further having a control terminal coupled to said node of said resistor divider network such that the first transistor is turned on and off as a function of said power source voltage and, when said first transistor is on, said power source tends to drive said output terminal to a first logic level through said first transistor; and
   a second transistor coupled to said output terminal so as to drive said output terminal to a second logic level, said second transistor configured relative to said first transistor such that, when both said first and said second transistors are on, said output terminal is driven to about said voltage level of said primary power source through said first transistor;
   whereby, when said power source voltage drops below a predetermined level, said first transistor turns off, allowing said output level to switch from said first logic level to said second logic level.

2. The detector circuit of claim 1 wherein, when said output terminal is at said first level, it indicates that said power source is operational and, when said output terminal is at said second level, it indicates that said power source is not operational.

3. An integrated circuit incorporating said detector circuit of claim 2, said integrated circuit further comprising a secondary power source and wherein, when said output terminal is at said first level, said integrated circuit draws power from said power source, and when said output terminal is at said second level, said integrated circuit draws power from said secondary power source.

4. An integrated circuit of claim 3 wherein said first and second transistors are CMOS transistors.

5. An integrated circuit of claim 4 wherein said first transistor is a p-channel transistor and said second transistor is an n-channel transistor.

6. An integrated circuit of claim 5 wherein said pair of current flow terminals of said first and second transistors comprise source and drain terminals, respectively, and said current control terminals of said first and second transistors comprise gate terminals.

7. An integrated circuit of claim 6 wherein said source terminal of said first transistor is coupled to said power source, said drain terminal of said first transistor is coupled to said output terminal, said source terminal of said second transistor is coupled to said fixed voltage, and said drain terminal of said second transistor is coupled to said output terminal.

8. An integrated circuit of claim 7 wherein said fixed voltage is ground.

9. An integrated circuit of claim 7 wherein said power source voltage is a higher voltage than said fixed voltage.

10. An integrated circuit of claim 9 wherein said power source voltage is nominally 3.3 volts and said fixed voltage is ground.

11. The detector circuit of claim 1 wherein said second transistor has a longer channel than said first transistor such that, when both said first and said second transistors are on, said output terminal is driven to about said power source voltage.

12. The detector circuit of claim 11 wherein said second transistor comprises a pair of current flow terminals coupled between said output terminal and a fixed voltage and a control terminal coupled to an auxiliary power source such that said second transistor is turned on by said auxiliary power source.

13. The detector circuit of claim 11 further comprising:
    an inverter having an input terminal coupled to a fixed voltage, a power supply terminal coupled to an auxiliary power source, and an output terminal; and
    wherein said second transistor comprises a pair of current flow terminals coupled between said output terminal and said fixed voltage and a control terminal coupled to said output of said inverter.

14. The detector circuit of claim 1 adapted for operation in an IDDQ friendly mode, said circuit further comprising a third transistor having first and second current flow terminals coupled between said power supply and said resistor divider network and a control terminal coupled to an IDDQ friendly mode indicator signal, said IDDQ friendly mode indicator signal configured to turn said third transistor off when asserted and to turn said third transistor on when unasserted.

15. The detector circuit of claim 14 wherein said IDDQ mode indicator signal is coupled to turn said second transistor on when asserted.

16. The detector circuit of claim 15 wherein said second transistor has a current control terminal coupled to said IDDQ friendly mode indicator signal such that, when said IDDQ friendly mode indicator signal is asserted, said second transistor is turned on and, when said IDDQ friendly mode indicator signal is unasserted, said second transistor is turned off.

17. The detector circuit of claim 16 further comprising an inverter coupled between said control terminal of said second transistor and said IDDQ friendly mode indicator signal, said inverter being powered by an auxiliary power source.

18. An integrated circuit of claim 3 wherein said second transistor has a higher impedance than said first transistor when both are in the on state.

19. The detector circuit of claim 18 further comprising an inverter having an input coupled to said fixed voltage, an output coupled to said control input of said second transistor and a power supply terminal coupled to said secondary power source.

20. The detector circuit of claim 19 wherein said first transistor is a p-channel transistor and wherein said power source has a nominal voltage higher than said fixed voltage.

21. The detector circuit of claim 20 wherein said nominal voltage is 3.3 volts and said fixed voltage is ground.

22. The detector circuit of claim 1 wherein said output terminal is a power source switching signal that, when at said first level, indicates that said power source is generating a voltage above a predetermined minimum voltage and, when at said second level, is not generating a voltage above said predetermined minimum voltage.

23. The detector circuit of claim 22 wherein said resistor divider network comprises first and second resistors and said node is between said first and second resistors and wherein said first and second resistors have a resistance ratio relative to each other such that the voltage drop between said power source and said node when said power source is generating said predetermined minimum voltage is equal to a threshold voltage of said first transistor.

24. A method of generating a power source switching signal when a primary voltage source in a circuit has dropped below a predetermined voltage so that an auxiliary power source should be used to power said circuit, said method comprising the steps of:

dividing a primary voltage generated by a primary voltage source to generate a fractional voltage thereof;

providing said primary voltage to an output terminal through a first transistor, said first transistor being controlled to be turned on or off by said fractional voltage, wherein the ratio of said fractional voltage to said primary voltage is selected such that said first transistor is turned off when said voltage of said primary voltage source drops below a predetermined voltage;

providing a second voltage to said output terminal through a second transistor, said second transistor being controlled to be turned on or off by an auxiliary power source;

said second transistor configured relative to said first transistor such that, when both said first and said second transistors are on, said output terminal is driven to about said primary voltage through said first transistor;

whereby, when said primary voltage drops below said predetermined level, said first transistor turns off, allowing said output terminal to be driven to about said second voltage through said second transistor, the voltage at said output terminal comprising said power source switching signal.

25. The method of claim 24 wherein said dividing step comprises passing said voltage generated by said voltage source through a resistor divider network.

26. The method of claim 24 wherein said second transistor having a higher impedance than said first transistor while both are in the on state has a longer channel that the channel of the first transistor.

27. The method of claim 26 wherein said generating step further comprises coupling a control terminal of said second transistor to said second voltage source through an inverter, said inverter being powered by said auxiliary power source.

* * * * *